US012652034B2

(12) United States Patent
Liao et al.

(10) Patent No.: US 12,652,034 B2
(45) Date of Patent: Jun. 9, 2026

(54) SENSOR BASED POWER SWITCH CONTROL METHOD AND SENSOR BASED POWER SWITCH METHOD CAPABLE OF FAST TURNING ON POWER SWITCHES

(71) Applicant: MEDIATEK INC., Hsin-Chu (TW)

(72) Inventors: Fan-Wei Liao, Hsinchu City (TW); Tai-Ying Jiang, Hsinchu City (TW); Chien-Sheng Chao, Hsinchu City (TW); Bo-Yun Lin, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 0 days.

(21) Appl. No.: 18/740,448

(22) Filed: Jun. 11, 2024

(65) Prior Publication Data

US 2025/0379571 A1     Dec. 11, 2025

(51) Int. Cl.
*H03K 17/04*          (2006.01)
*H03K 17/042*          (2006.01)
(52) U.S. Cl.
CPC ................................. H03K 17/042 (2013.01)
(58) Field of Classification Search
CPC ................................................... H03K 17/042
See application file for complete search history.

(56) References Cited

U.S. PATENT DOCUMENTS

| | | | |
|---|---|---|---|
| 6,445,047 B1 * | 9/2002 | Yamada | H10D 84/014 |
| | | | 257/315 |
| 2015/0028943 A1 * | 1/2015 | Govindaraj | G06F 1/3287 |
| | | | 327/543 |
| 2016/0139656 A1 * | 5/2016 | Upputuri | G06F 1/3287 |
| | | | 713/323 |
| 2018/0065496 A1 | 3/2018 | Reynolds | |
| 2019/0146569 A1 * | 5/2019 | Nge | H02M 1/32 |
| | | | 713/320 |

* cited by examiner

*Primary Examiner* — Daniel C Puentes
(74) *Attorney, Agent, or Firm* — Winston Hsu

(57) ABSTRACT

A sensor based power switch control method includes setting a maximum inrush current, turning on at least one first power switches for charging a loading circuit from a high voltage terminal through the at least one first power switches, sensing a first charging current of the at least one first power switches being turned on by a first sensor, and turning on at least one second power switches for charging the loading circuit from the high voltage terminal through the at least one second power switches when the first charging current starts to drop.

17 Claims, 5 Drawing Sheets

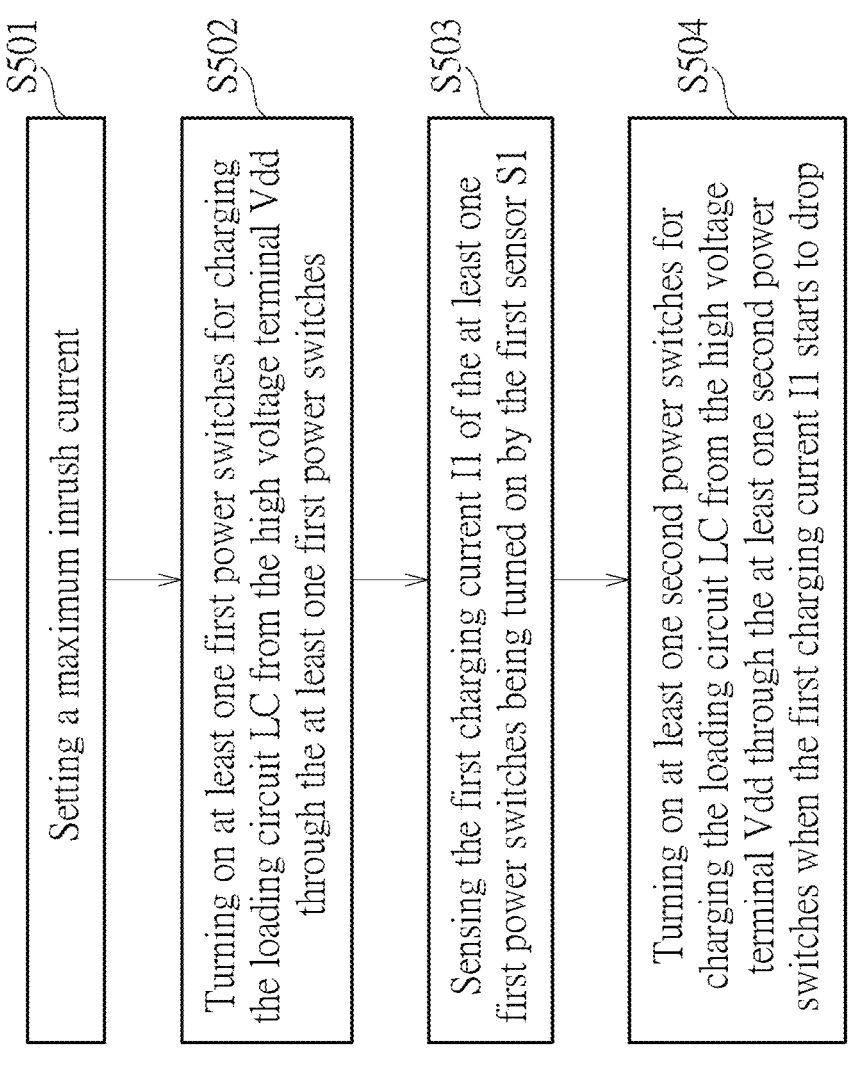

S501

Setting a maximum inrush current

S502

Turning on at least one first power switches for charging the loading circuit LC from the high voltage terminal Vdd through the at least one first power switches

S503

Sensing the first charging current I1 of the at least one first power switches being turned on by the first sensor S1

S504

Turning on at least one second power switches for charging the loading circuit LC from the high voltage terminal Vdd through the at least one second power switches when the first charging current I1 starts to drop

FIG. 5

SENSOR BASED POWER SWITCH CONTROL METHOD AND SENSOR BASED POWER SWITCH METHOD CAPABLE OF FAST TURNING ON POWER SWITCHES

BACKGROUND

The design of power switches used for turning on and turning off a power supply to logic gates is commonly implemented for saving power in very large-scale integration (VLSI) designs. A large inrush current may occur when the power switches are turned on concurrently. Particularly, the large inrush current may cause a voltage drop in other power domain, endangering the operations of surrounding active circuits in other power domain.

Currently, instead of concurrently turning on all power switches, a plurality of power switch chains with delay buffers or software delay control mechanisms are used for sequentially turning on the power switches. Further, in the same power switch chain, since the delay buffers are introduced for sequentially turning on the power switches by a power on/off request, the large inrush current can be avoided. However, the delay buffer-based power switch chains and the software delay control mechanism-based power switch chains may introduce large latency for turning on power switches since real-time electrical states of the power switches cannot be detected.

Therefore, developing a power switch control method capable of fast turning on the power switches is an important issue.

SUMMARY

In an embodiment of the present invention, a sensor based power switch control method is disclosed. The sensor based power switch control method comprises setting a maximum inrush current, turning on at least one first power switches for charging a loading circuit from a high voltage terminal through the at least one first power switches, sensing a first charging current of the at least one first power switches being turned on by a first sensor, and turning on at least one second power switches for charging the loading circuit from the high voltage terminal through the at least one second power switches when the first charging current starts to drop.

In another embodiment of the present invention, a sensor based power switch control method is disclosed. The sensor based power switch control method comprises turning on at least one first power switches for charging a loading circuit from a high voltage terminal through the at least one first power switches, sensing a first voltage gap between the high voltage terminal and the loading circuit, and turning on at least one second power switches for charging the loading circuit from the high voltage terminal through the at least one second power switches according to the first voltage gap.

In another embodiment of the present invention, a sensor based power switch control system is disclosed. The sensor based power switch control system comprises a power control circuit, a first sensor coupled to the power control circuit, at least one first power switches coupled to the first sensor, and a loading circuit coupled to the at least one first power switches. After the maximum inrush current is set, the at least one first power switches is turned on for charging a loading circuit from a high voltage terminal through the at least one first power switches. The first sensor senses a first charging current of the at least one first power switches being turned on. When the first charging current starts to drop, at least one second power switches is turned on for charging the loading circuit from the high voltage terminal through the at least one second power switches.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a flow chart of performing a sensor based power switch control method by the sensor based power switch control system in FIG. 1.

DETAILED DESCRIPTION

Figure 1:
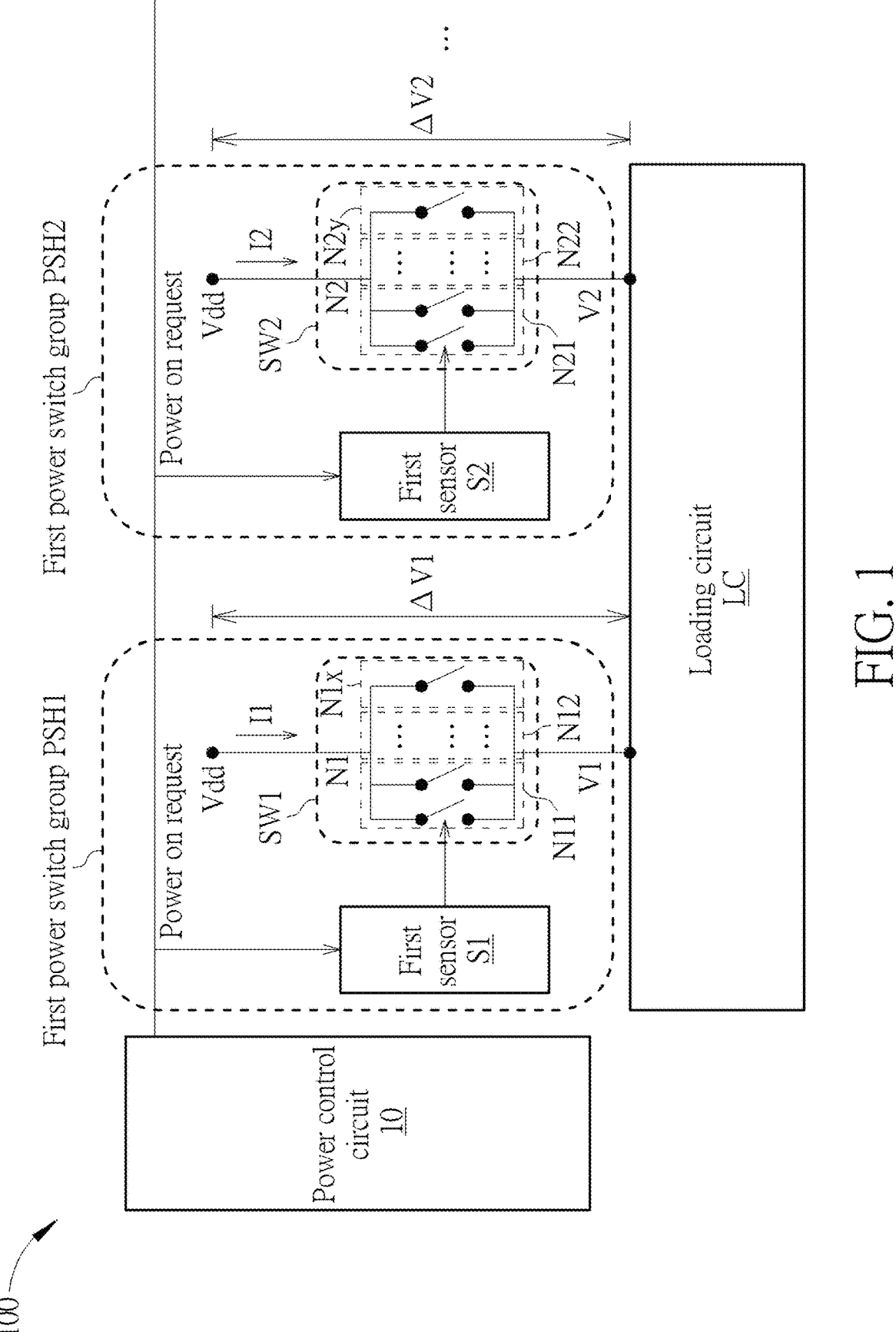
FIG. 1 is a sensor based power switch control system according to an embodiment of the present invention.

FIG. 1 is a sensor based power switch control system 100 according to an embodiment of the present invention. The sensor based power switch control system 100 can include a plurality of power switch groups for providing power to various logical blocks. For example, the sensor based power switch control system 100 can include a power control circuit 10, a first sensor S1, N1 first power switches SW1, a second sensor S2, N2 second power switches SW2, and a loading circuit LC. The first sensor S1 is coupled to the power control circuit 10. The N1 first power switches SW1 are coupled to the first sensor S1. The loading circuit LC is coupled to the N1 first power switches SW1 and coupled to the N2 second power switches SW2. The second sensor S2 is coupled to the power control circuit 10. The N2 second power switches SW2 are coupled to the second sensor S2. In the sensor based power switch control system 100, all power switches can be multi-threshold complementary metal-oxide-semiconductor (MTCMOS) power switches. The sensor based power switch control system 100 can fast turn on all power switches automatically and avoid endangering the operations of active circuits in other power domains. Details are illustrated below.

In the sensor based power switch control system 100, a maximum inrush current can be configured according to a signoff voltage range. The maximum inrush current can be regarded as a maximum tolerable current of the loading circuit LC in the power domain. Then, the power control circuit 10 can turn on each of the power switch groups. The current and voltage information inside the first power switch group may be detected by the sensor. In the present embodiment, the first power switch group PSH1 and the second power switch group PSH2 are turned on according to the power control circuit 10. The voltage and current information inside the first power switch group is detected by the first sensor S1. Once the voltage and the current information meet a predetermined threshold, the sensor S1 may send a control signal to the N1 first power switches. The N1 first power switches may be turned on sequentially upon the control signal for charging the loading circuit LC from a high voltage terminal Vdd through the N1 first power switches SW1.

Here, N1 can be initially configured and can be a positive integer. To be clear, the N1 first power switches SW1 can be divided into N11, N12, . . . , and N1x subgroups. Each subgroup includes at least one first power switch. Each of the subgroups is coupled with the first sensor S1 to receive the control signals. The subgroups N11, N12, . . . . N1x would be turned on subsequently upon the received control signals. In some embodiment, the number of the power switches may be various in different subgroups N11, N12, . . . . N1x.

After the subgroup N11 of the N1 first power switches SW1 is turned on, a first charging current I1 of the at least one first power switch of the subgroup N11 can be generated from the high voltage terminal Vdd to the loading circuit LC. The first charging current I1 is smaller than the maximum inrush current. Then, since a first voltage gap $\Delta V1$ between the high voltage terminal Vdd and the loading circuit LC (i.e., $\Delta V1=|Vdd-V1|$) is initially large, the first charging current I1 is increased to approach the maximum inrush current. Since the first charging current I1 is generated and gradually increased to approach the maximum inrush current, the loading circuit LC is charged over time. As a result, a voltage level (V1) of the loading circuit LC is gradually increased. Therefore, the first voltage gap $\Delta V1$ between the high voltage terminal Vdd and the loading circuit LC (i.e., $\Delta V1=|Vdd-V1|$) starts to drop.

Since the sensor based power switch control system 100 is designed for providing a fast power-on mechanism, the first sensor S1 can continuously sense the first charging current I1 of the at least one first power switch of the subgroup N11 of the N1 first power switches SW1. In other words, the first sensor S1 can be used for detecting electrical states of the at least one first power switch of the subgroup N11 in real-time. When the first voltage gap $\Delta V1$ between the high voltage terminal Vdd and the loading circuit LC starts to drop, the first charging current I1 of the N1 first power switches starts to drop accordingly. Once the first charging current I1 starts to drop, the first sensor S1 can transmit a message to a next subgroup to be turned on. For example, the first sensor S1 can transmit the message to the subgroup N12 to be turned on. After the subgroup N12 is turned on, at least one first power switch of the subgroup N12 can be used for charging the loading circuit LC from the high voltage terminal Vdd through the at least one first power switch of the subgroup N12.

Similarly, Here, N2 can be initially configured and can be a positive integer. To be clear the N2 second power switches SW2 can be divided into N21, N22, . . . , and N2y subgroups. Each subgroup includes at least one second power switch. Each of the subgroups is coupled with the second sensor S2 to receive the control signals. The subgroups N21, N22, . . . . N2y would be turned on subsequently upon the received control signals. In some embodiment, the number of the power switches may be various in different subgroups N21, N22, . . . . N2y.

After the subgroup N21 of the N2 first power switches SW2 is turned on, a second charging current I2 of the at least one second power switch of the subgroup N21 can be generated from the high voltage terminal Vdd to the loading circuit LC. Then, since a second voltage gap $\Delta V2$ between the high voltage terminal Vdd and the loading circuit LC (i.e., $\Delta V2=|Vdd-V2|$) is initially large, the second charging current I2 is increased to approach the maximum inrush current. Then, the loading circuit LC is charged over time. As a result, a voltage level V2 of the loading circuit LC is gradually increased. Therefore, the second voltage gap $\Delta V2$ between the high voltage terminal Vdd and the loading circuit LC (i.e., $\Delta V2=[Vdd-V2]$) starts to drop. Similarly, the second sensor S2 can continuously sense the second charging current I2 of the at least one second power switch of the subgroup N21 of the N2 second power switches SW2. Similarly, once the second charging current I2 starts to drop, the second sensor S2 can transmit a message to a next subgroup to be turned on. For example, the second sensor S2 can transmit the message to the subgroup N22 to be turned on. After the subgroup N22 is turned on, at least one second power switch of the subgroup N22 can be used for charging the loading circuit LC from the high voltage terminal Vdd through the at least one second power switch of the subgroup N22.

In the sensor based power switch control system 100, a total inrush current can be defined as charging currents from a power domain to a loading domain through a plurality of power switches being turned on. For example, the total inrush current of charging the loading circuit LC can be controlled to approach the maximum inrush current by the first charging current I1 and the second charging current I2. The total inrush current can include the first charging current I1 and the second charging current I2. When the first charging current I1 starts to drop, at least one first power switch SW1 of another subgroup of the first power switch group PSH1 can be turned on so that the first charging current I1 can be increased. Similarly, when the second charging current I2 starts to drop, at least one second power switch SW2 of another subgroup of the second power switch group PSH2 can be turned on so that the second charging current I2 can be increased. By doing so, since a plurality of sensors are introduced to the sensor based power switch control system 100, the total inrush current can be controlled by charging currents of power switches being turned on. As a result, since the sensors can obtain dynamic and real-time electrical states of the power switches, the latency for turning on all power switches can be reduced.

In the sensor based power switch control system 100, any technology or hardware modification falls into the scope of the present invention. For example, first, the power control circuit 10 turns on at least one first power switch SW1 of the subgroup N11 of the first power switch group PSH1 for charging the loading circuit LC from the high voltage terminal Vdd through the at least one first power switch SW1 of the subgroup N11. Then, the first sensor S1 can sense the first voltage gap $\Delta V1$ between the high voltage terminal Vdd and the loading circuit LC. In particular, the first voltage gap $\Delta V1$ between the high voltage terminal Vdd and the loading circuit LC (i.e., $\Delta V1=|Vdd-V1|$) is initially large before the loading circuit LC is fully charged. Then, the power control circuit 10 can further turn on additional at least one first power switch SW1 of the subgroup N12 of the first power switch group PSH1 according to the first voltage gap $\Delta V1$. In the embodiment, a higher first voltage gap $\Delta V1$ implies that the power domain (i.e., the high voltage terminal Vdd) can provide more power for pushing numerous stages of turning on power switches. As a result, the number of additional at least one first power switch SW1 of the subgroup N12 being turned on is positively related to the first voltage gap $\Delta V1$. In other words, when the first voltage gap $\Delta V1$ is increased, the power control circuit 10 can turn on more power switches after the at least one first power switch SW1 of the subgroup N11 is turned on.

Figure 2:
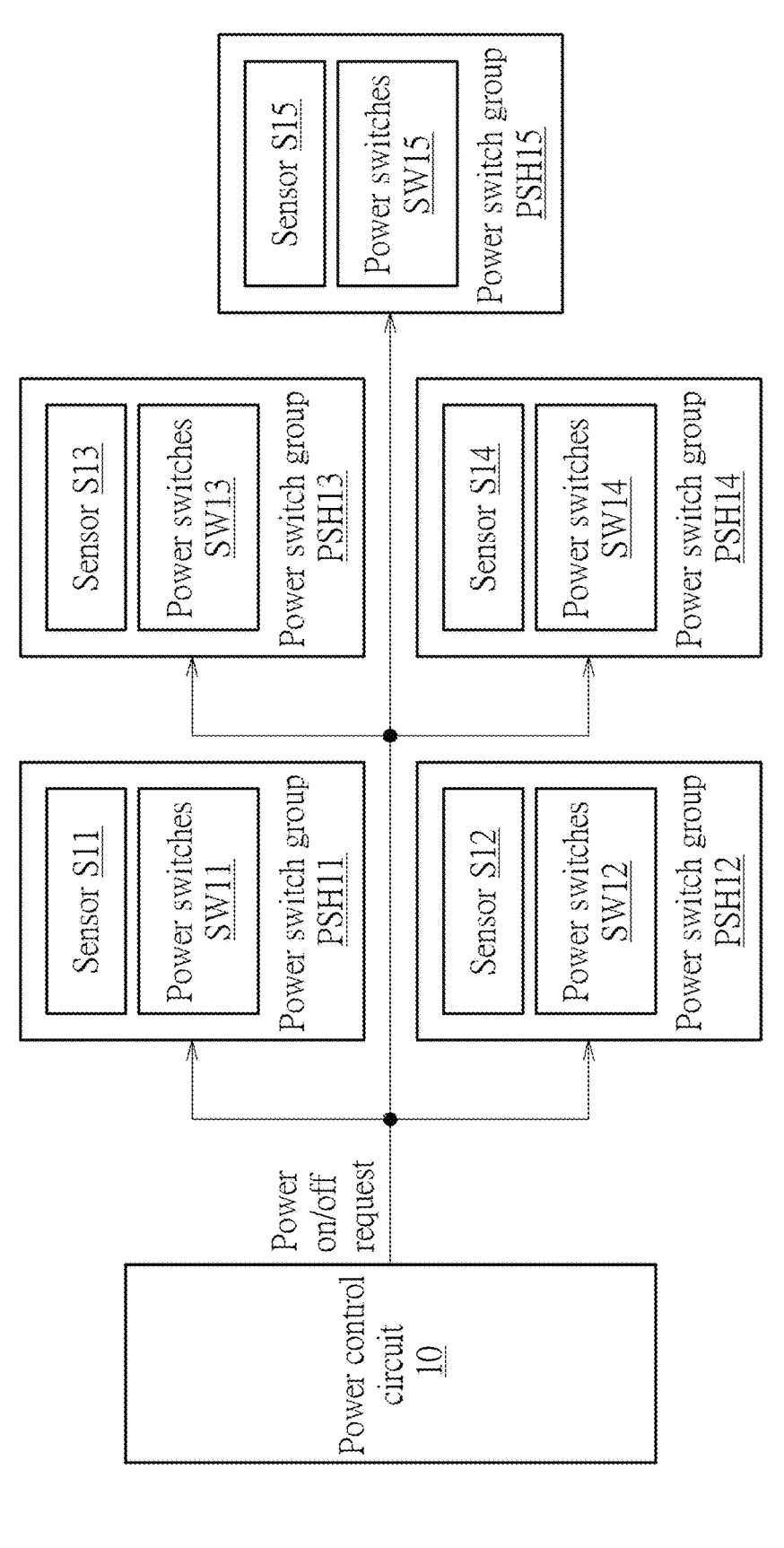
FIG. 2 is a sensor based power switch control system according to another embodiment of the present invention.

FIG. 2 is a sensor based power switch control system 200 according to another embodiment of the present invention. In the present invention, the sensor based power switch control system can be applied in various structures. To avoid ambiguity, a sensor based power switch control system in FIG. 2 is called as a sensor based power switch control system 200 hereafter. The sensor based power switch control system 200 can include a plurality of power switch groups PSH11 to PSH15. In FIG. 1, the N1 first power switches SW1 and the first sensor S1 can form a first power switch group PSH1. The N2 second power switches and the second sensor S2 form a second power switch group PSH2. In FIG. 2, power switches SW11 and a sensor S11 form a power switch group PSH11. Power switches SW12 and a sensor S12 form a power switch group PSH12. Power switches SW13 and a sensor S13 form a power switch group PSH13. Power switches SW14 and a sensor S14 form a power switch group PSH14. Power switches SW15 and a sensor S15 form a power switch group PSH15. The power control circuit 10 can generate a power-on request for turning power switches of the power switch groups PSH11 to PSH15 according to sensing data of the sensor S11 to sensor S15. Further, the power control circuit 10 can generate a power-off request for turning off some power switches for saving power. By doing so, since the sensor based power switch control system 200 is capable of fast turning on all power switch groups. The opportunity of turning off the power domain (one or more power switch groups) can be increased.

Figure 3:
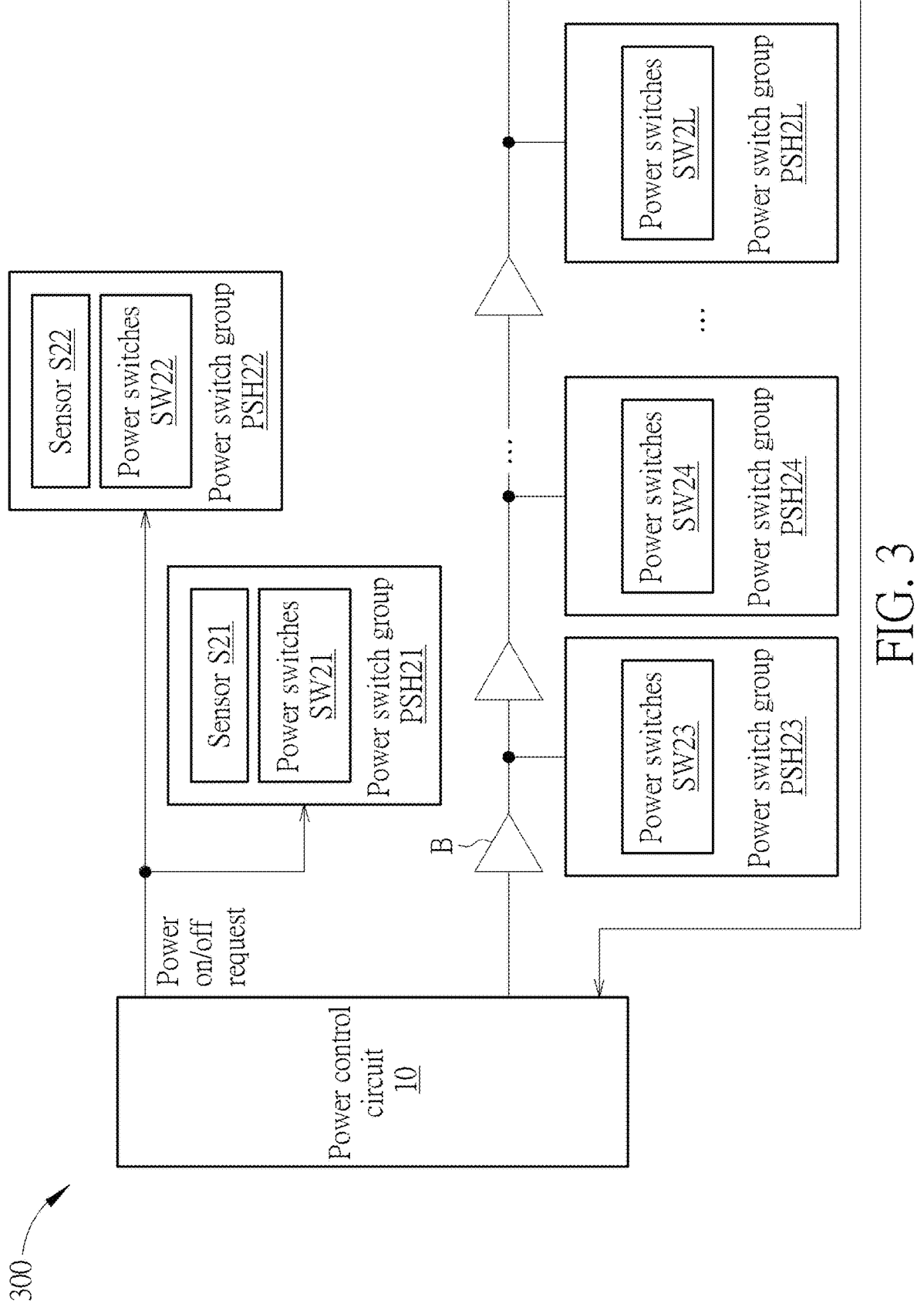
FIG. 3 is a sensor based power switch control system according to another embodiment of the present invention.

FIG. 3 is a sensor based power switch control system 300 according to another embodiment of the present invention. To avoid ambiguity, a sensor based power switch control system in FIG. 3 is called as a sensor based power switch control system 300 hereafter. The sensor based power switch control system 300 can include a plurality of power switch groups PSH21, PSH22, and PSH23 to PSH2L. In FIG. 3, a power switch chain without buffers can include the power switch group PSH21 and the power switch group PSH22. The power switch group PSH21 includes power switches SW21 and a sensor S21. The power switch group PSH22 includes power switches SW22 and a sensor S22. Since the sensors S21 and S22 are introduced to the power switch chain, the power switch groups PSH21 and PSH22 of the power switch chain can be optimally and dynamically turned on. Further, another power switch chain with buffers B can include the power switch groups PSH23 to PSH2L. The power switch group PSH23 includes power switches SW23. The power switch group PSH24 includes power switches SW24. The power switch group PSH2L includes power switches SW2L. Since no sensor is introduced to another power switch chain, the power switch groups PSH23 to PSH2L of another power switch chain can be sequentially turned on according to a fixed delay period designed by the buffers B.

Figure 4:
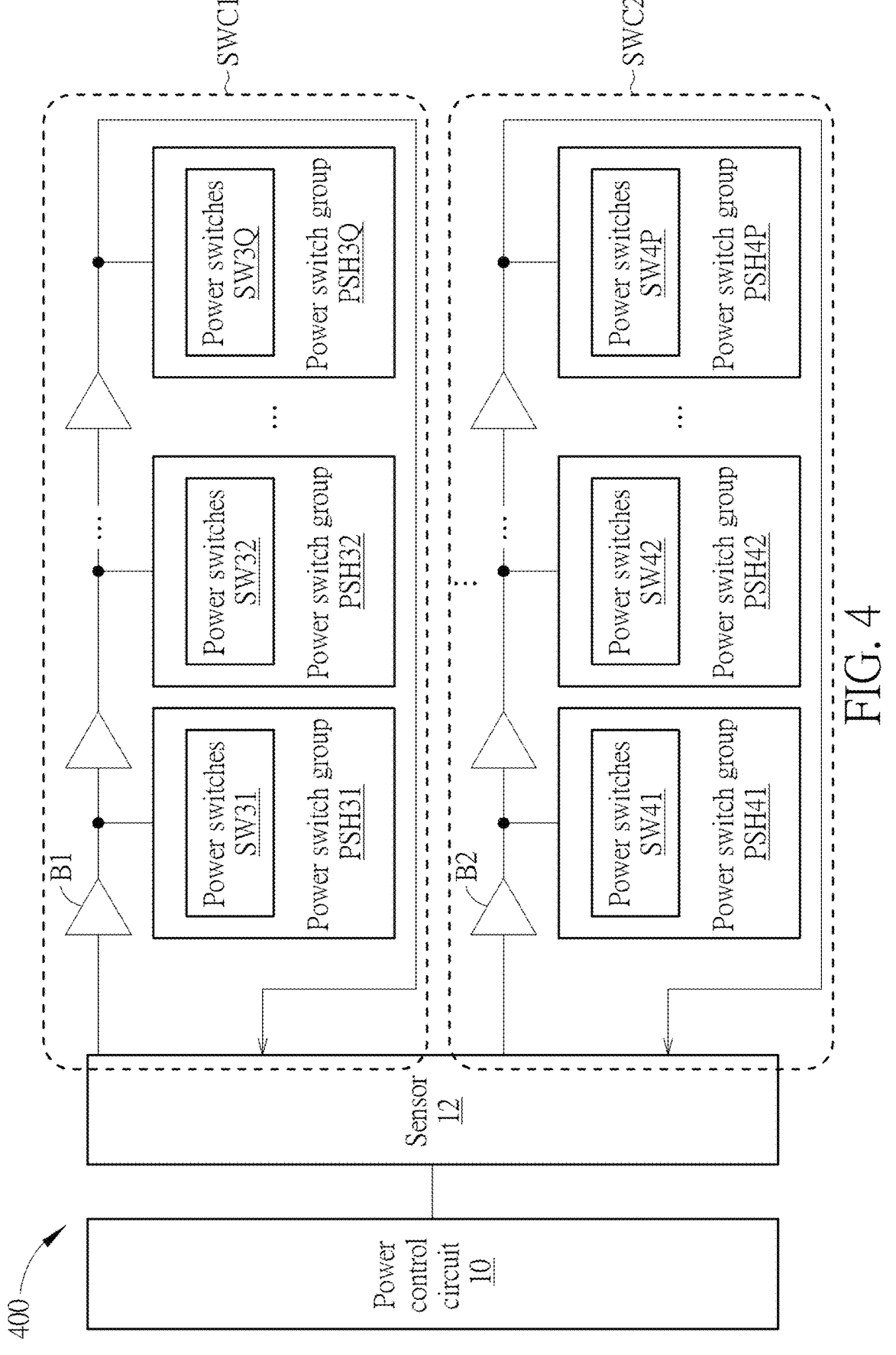
FIG. 4 is a sensor based power switch control system according to another embodiment of the present invention.

FIG. 4 is a sensor based power switch control system 400 according to another embodiment of the present invention. To avoid ambiguity, a sensor based power switch control system in FIG. 4 is called as a sensor based power switch control system 400 hereafter. The sensor based power switch control system 400 can include a power switch chain SWC1 and a power switch chain SWC2. The power switch chain SWC1 and a power switch chain SWC2 can include a plurality of buffers B1 and a plurality of buffers B2 respectively. Here, the power switch chain SWC1 can include a plurality of power switch groups, such as the power switch group PSH31 to the power switch group PSH3Q. The power switch group PSH31 includes power switches SW31. The power switch group PSH32 includes power switches SW32. The power switch group PSH3Q includes power switches SW3Q. Since no sensor is introduced to the power switch chain SWC1, the power switch groups PSH31 to PSH3Q of the power switch chain SWC1 can be sequentially turned on according to a fixed delay period designed by the buffers B1.

Similarly, the power switch chain SWC2 can include a plurality of power switch groups, such as the power switch group PSH41 to the power switch group PSH4P. The power switch group PSH41 includes power switches SW41. The power switch group PSH42 includes power switches SW42. The power switch group PSH4P includes power switches SW4P. Since no sensor is introduced to the power switch chain SWC2, the power switch groups PSH41 to PSH4P of the power switch chain SWC2 can be turned on according to a fixed delay period designed by the buffers B2. In FIG. 4, the sensor 12 in introduced to sense charging currents and/or voltages of the power switch chain SWC1 and the power switch chain SWC2. As a result, the power control circuit 10 can control the power switch chain SWC1 for sequentially turning on the power switch groups PSH31 to PSH3Q, and further control the power switch chain SWC2 for sequentially turning on the power switch groups PSH41 to PSH4P according to sensing data of the sensor 12. P and Q are positive integers. In other words, a chain-scaled switch control mechanism is introduced to the sensor based power switch control system 400.

FIG. 5 is a flow chart of performing a sensor based power switch control method by the sensor based power switch control system 100. The sensor based power switch control method includes step S501 to step S504. Any reasonable technology modification falls into the scope of the present invention. Step S501 to step S504 are illustrated below.

step S501: setting a maximum inrush current;
step S502: turning on at least one first power switches for charging the loading circuit LC from the high voltage terminal Vdd through the at least one first power switches;
step S503: sensing the first charging current I1 of the at least one first power switches being turned on by the first sensor S1;
step S504: turning on at least one second power switches for charging the loading circuit LC from the high voltage terminal Vdd through the at least one second power switches when the first charging current I1 starts to drop.

Details of step S501 to step S504 are previously illustrated. Thus, they are omitted here. In the sensor based power switch control system 100, since at least one sensor is introduced for sensing charging currents or voltage gaps of a plurality of power switch groups, real-time electrical states of the power switches can be detected. Therefore, the power switches can be automatically controlled by using at least one sensor. As a result, latency for turning on the power switches can be reduced.

To sum up, the present invention discloses a sensor based power switch control method and a sensor based power switch control system. The sensor based power switch control system introduces at least one sensor for sensing charging currents or voltage gaps of a plurality of power switch groups. In some or all power switch groups, the power switches can be connected as a power switch chain or can be controlled separately by at least one sensor. At least one sensor can detect real-time electrical states of the power switches. Therefore, the power control circuit can turn on the power switches according to the charging currents or voltage gaps detected by at least one sensor. Further, the power control circuit can turn off some power switches for saving power. In the sensor based power switch control system, since the power switches can be automatically controlled by using at least one sensor, latency for turning on the power switches can be reduced. Further, since the latency for turning on the power switches can be reduced, the opportunity of turning off the power domain (one or more power switch groups) can be increased. The impact of an inrush current can also be mitigated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sensor based power switch control method comprising:

setting a maximum inrush current;

turning on at least one first power switches for charging a loading circuit from a high voltage terminal through the at least one first power switches;

sensing a first charging current of the at least one first power switches being turned on by a first sensor;

turning on at least one second power switches for charging the loading circuit from the high voltage terminal through the at least one second power switches when the first charging current starts to drop; and sensing a second charging current from the high voltage terminal to the loading circuit by a second sensor; and turning on at least one additional power switch when the second charging current starts to drop.

2. The method of claim 1, wherein the first charging current is smaller than the maximum inrush current.

3. The method of claim 1, wherein after the at least one first power switches are turned on for charging the loading circuit from the high voltage terminal, the first charging current is increased to approach the maximum inrush current.

4. The method of claim 3, wherein after the first charging current is increased to approach the maximum inrush current, a first voltage gap between the high voltage terminal and the loading circuit starts to drop.

5. The method of claim 4, wherein after the first voltage gap between the high voltage terminal and the loading circuit starts to drop, the first charging current starts to drop.

6. The method of claim 1, wherein after the at least one second power switches are turned on for charging the loading circuit from the high voltage terminal, the first charging current is increased to approach the maximum inrush current.

7. The method of claim 6, wherein a total inrush current of charging the loading circuit is controlled to approach the maximum inrush current by the first charging current.

8. The method of claim 1, further comprises:

generating a first message for turning on the at least one first power switches by the first sensor; and generating a second message for turning on the at least one second power switches by the first sensor.

9. A sensor based power switch control system comprising:

a power control circuit;

a first sensor coupled to the power control circuit;

a second sensor;

at least one first power switches coupled to the first sensor; and a loading circuit coupled to the at least one first power switches;

wherein after the maximum inrush current is set, the at least one first power switches is turned on for charging a loading circuit from a high voltage terminal through the at least one first power switches, the first sensor senses a first charging current of the at least one first power switches being turned on, and when the first charging current starts to drop, at least one second power switches is turned on for charging the loading circuit from the high voltage terminal through the at least one second power switches; and wherein the second sensor senses a second charging current from the high voltage terminal to the loading circuit, and when the second charging current starts to drop, at least one additional power switch is turned on.

10. The system of claim 9, wherein the first charging current is smaller than the maximum inrush current.

11. The system of claim 9, wherein after the at least one first power switches are turned on for charging the loading circuit from the high voltage terminal, the first charging current is increased to approach the maximum inrush current.

12. The system of claim 11, wherein after the first charging current is increased to approach the maximum inrush current, a first voltage gap between the high voltage terminal and the loading circuit starts to drop.

13. The system of claim 12, wherein after the first voltage gap between the high voltage terminal and the loading circuit starts to drop, the first charging current starts to drop.

14. The system of claim 9, wherein after the at least one second power switches are turned on for charging the loading circuit from the high voltage terminal, the first charging current is increased to approach the maximum inrush current.

15. The system of claim 14, wherein a total inrush current of charging the loading circuit is controlled to approach the maximum inrush current by the first charging current.

16. The system of claim 9, wherein the first sensor generates a first message for turning on the at least one first power switches, and the first sensor generates a second message for turning on the at least one second power switches.

17. The system of claim 9, wherein the at least one first power switches and at least one second power switches are multi-threshold complementary metal-oxide-semiconductor (MTCMOS) power switches.

* * * * *